United States Patent [19]

Alter

[11] Patent Number: 4,979,001
[45] Date of Patent: Dec. 18, 1990

[54] HIDDEN ZENER DIODE STRUCTURE IN CONFIGURABLE INTEGRATED CIRCUIT

[75] Inventor: Martin J. Alter, Los Altos, Calif.

[73] Assignee: Micrel Incorporated, Sunnyvale, Calif.

[21] Appl. No.: 374,512

[22] Filed: Jun. 30, 1989

[51] Int. Cl.$^5$ ............................................. H01L 29/90
[52] U.S. Cl. ........................................ 357/13; 357/41; 357/51; 357/48; 357/23.4; 357/15; 357/43
[58] Field of Search .................... 357/13, 41, 15, 52, 357/52 D, 47, 48, 43, 34, 23.4, 51, 23.12, 40

[56] References Cited

U.S. PATENT DOCUMENTS

| | | | |
|---|---|---|---|
| 3,735,210 | 5/1973 | Kalish et al. | 317/234 R |
| 3,909,837 | 9/1975 | Kronlage | 357/48 X |
| 4,293,868 | 10/1981 | Iizuka et al. | 357/46 |
| 4,419,681 | 12/1983 | Schmitz | 357/13 |
| 4,589,004 | 5/1986 | Yasuda et al. | 357/23.4 |
| 4,651,178 | 3/1987 | Avery | 357/13 |
| 4,742,021 | 5/1988 | Burnham et al. | 437/149 |
| 4,758,537 | 7/1988 | Jennings | 437/164 |
| 4,887,142 | 12/1989 | Bertohi et al. | 357/48 X |

FOREIGN PATENT DOCUMENTS 59-13378  1/1984  Japan ................. 357/13 Z

OTHER PUBLICATIONS

Chang et al., "Schottky Barrier Diode with Self-Aligned Guard Ring," *IBM Technical Disclosure Bulletin*, vol. 26, No. 9, Feb. 1984, pp. 4498-4499.
Edwards et al., "Method to Improve Yield of the Array Chips which Use Ion-Implanted Resistors," *IBM Technical Disclosure Bulletin*, vol. 23, No. 6, Nov. '80, 2298-2299.
Gates, "Buried Resistor Structure," *IBM Technical Disclosure Bulletin*, vol. 12, No. 12, May 1970, p. 2061.
No Author, "Modular 'MM' Family Semicustom Linear Integrated Circuits with Computer-Aided Design," Custom Arrays Corporation Brochure, Sunnyvale, CA., pp. 1-7.

*Primary Examiner*—William Mintel
*Attorney, Agent, or Firm*—Skjerven, Morrill, MacPherson, Franklin & Friel

[57] ABSTRACT

In one embodiment of the invention, a P diffused region, acting as an anode of a zener diode, is formed within an N+ sinker which is part of a vertical transistor in a configurable integrated circuit. This N+ sinker contacts an N+ buried layer or an N+ substrate and provides an exposed contact region for the transistor. Conductivity types may, of course, be opposite to those described in this embodiment. In this way, an additional zener diode is made available to a user without requiring additional die area. Additionally, since the zener diode is not formed from emitter and base regions of a bipolar transistor, the breakdown voltage of the zener diode may be set as desired. By forming a P zener diode anode in all N+ sinkers, or, conversely, forming a N zener cathode in all P+ sinkers, a large number of zener diodes may be made available to a user without adding any die area to the configurable integrated circuit.

37 Claims, 4 Drawing Sheets

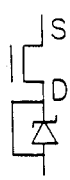
FIG. 4a    FIG. 4b
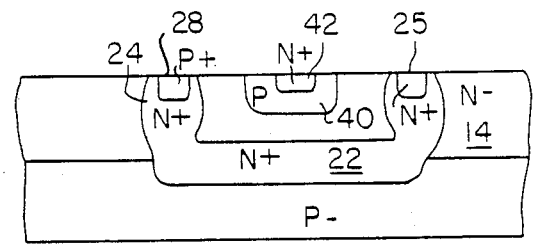
FIG. 5
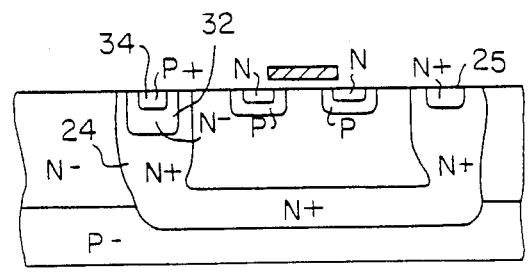
FIG. 6

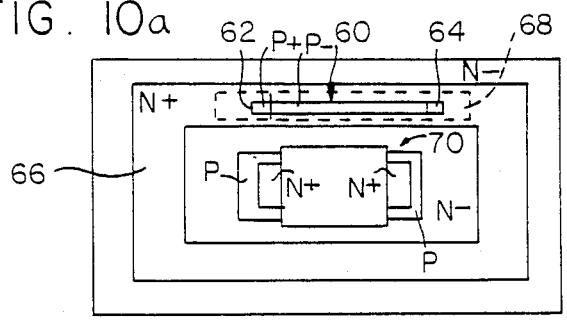
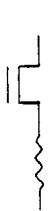 
FIG. 10b    FIG. 10c
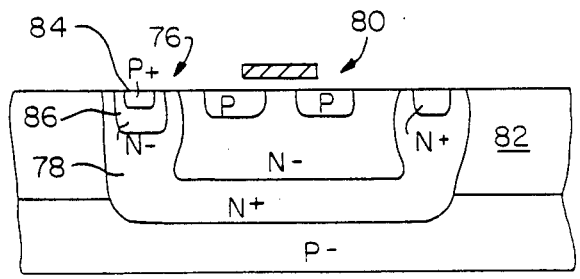
FIG. 11

4,979,001

HIDDEN ZENER DIODE STRUCTURE IN CONFIGURABLE INTEGRATED CIRCUIT

FIELD OF THE INVENTION

This invention relates to configurable integrated circuits and more particularly to a zener diode structure in a configurable integrated circuit which is hidden within an existing sinker so as to create a zener diode without requiring additional die area.

BACKGROUND OF THE INVENTION

In configurable integrated circuits, various components, such as transistors, resistors, junction capacitors, diodes, and zener diodes, each component having a variety of fixed values, are distributed on a single chip and not connected by any metallization layer. In a typical configurable integrated circuit where the user defines the metallization layer interconnecting the various components, the user selects various circuits and sub-circuit elements from a library of circuit elements to be used as building blocks in the design of a single chip system. The user may also design custom circuits using the various components available on the configurable chip. A software model of the various circuits and elements connected together is then created, and the system is simulated to see how the circuits and elements operate as a system.

Once the entire system is settled upon by the user, and the various interconnections between the individual components are established, a diskette or other memory device containing the user's desired interconnections is then used by the configurable integrated circuit manufacturer to automatically create a metallization mask. The configurable integrated circuit chip then undergoes a single photolithographic mask process and metallization process to form the interconnections between the various components on the chip.

A configurable integrated circuit manufacturer designs a particular class of chip to have a particular die size and incorporates as many components as feasible within that die size to give the user a large number of design options. Typically, each component is made separate so that if an individual component is not used, that portion of the die area taken up by that unused component is essentially wasted.

One such manufacturer of configurable integrated circuits is Custom Array Corporation in Sunnyvale, Calif. A configurable integrated circuit supplied by Custom Array Corporation enables the user to form zener diodes from the base and emitter regions of transistors. Thus, in this design where a zener diode and a transistor are formed from the same diffused regions, the characteristics of the zener diode are totally dependent upon, and subservient to, the design of the transistor. Consequently, the breakdown voltage of the zener diode is most likely not a value which would be optimum for a user. One advantage in this type of design, however, is that the zener diode requires no additional real estate and requires no additional wafer processing.

Typically many high breakdown voltage zener diodes are required in a power related integrated circuit for voltage regulation. If the zener diodes formed by the base and emitter regions of an existing transistor exhibit low breakdown voltages, a number of zener diodes must be connected in series if it is desired to achieve a resulting higher breakdown voltage. In the case of the Custom Array Corporation zener diode, using serial combinations of low breakdown voltage zener diodes greatly reduces the number of available transistors for other purposes.

FIG. 1 shows a prior art device which may be included in a configurable integrated circuit. Such a device is shown in U.S. Pat. No. 4,589,004 to Yasuda et al., incorporated herein by reference. In this device, a vertical DMOS device 4 uses a heavily doped sinker region 6 to contact a heavily doped buried layer 8 or a heavily doped substrate. The sinker and buried layer also act to lower the beta of any parasitic transistors. In FIG. 1, this sinker region and buried layer act as a drain region of vertical DMOS transistor 4, wherein highly doped sinker region 6 is exposed for eventual contact during metallization.

In the prior art, where a configurable integrated circuit incorporates a vertical transistor using a sinker region, such as shown in FIG. 1, any zener diode also included in the configurable integrated circuit is either a separate and independent device, using additional die area, or is formed using existing regions of a transistor, where the breakdown voltage of the zener diode is dictated by the design of the transistor.

A conventional zener diode (the term zener being used to also include avalanche diodes) is shown in FIG. 2, where a cathode region 9 is formed in a semiconductor substrate, and an anode region 10 is formed within the cathode. A zener diode may also be formed where the cathode region and the anode region are made side by side. When the zener diode is sufficiently reversed biased to cause breakdown, electron-hole pairs are created to thereby support a current, thus causing a voltage drop across the diode equal to its breakdown voltage.

Additional zener diode structures are shown in U.S. Pat. Nos. 4,758,537; 4,742,021; 4,735,210; 4,419,681; 4,293,868; and 3,735,210, all incorporated herein by reference.

What would be desirable in the industry is a zener diode structure for use in configurable integrated circuits which does not require additional die area in any way and which may be independently designed to have a desired breakdown voltage.

SUMMARY OF THE INVENTION

An object of this invention is to incorporate a large number of zener diodes on a configurable integrated circuit without dedicating any die area to the zener diodes and to form the zener diodes with selected breakdown voltages.

In one embodiment of the invention, a P diffused region is formed within an N+ sinker which is part of a vertical transistor in a configurable integrated circuit. This N+ sinker contacts an N+ buried layer or an N+ substrate and provides an exposed contact region for the transistor. Conductivity types may, of course, be opposite to those described in this embodiment. In this way, the impurity concentration of the zener diode regions may be selected without affecting the characteristics of the transistor. Additionally, if the zener diode is chosen to not be utilized, no die area is wasted by the nonuse of the zener diode.

By forming a P zener diode in all N+ sinkers, or, conversely, forming an N zener cathode in all P+ sinkers, a larger number of zener diodes may be made available without adding any die area to the configurable integrated circuit.

No problems with parasitic bipolar or MOS transistors arise due to the highly doped sinker reducing the beta of any parasitic transistor formed.

Further, higher breakdown voltage diodes may be formed by first forming within the sinker a more lightly doped region and then forming an anode or cathode region within the lightly doped region.

Still further, a rectangular P− region may be formed within the heavily doped sinker to form a resistor.

In high power applications where vertical transistors using sinkers are common, a large number of zener diodes are also required for voltage regulation. Therefore, the zener diode structure described above finds high applicability in power related configurable integrated circuits.

BRIEF DESCRIPTION OF THE DRAWINGS

FIGS. 4a and 4b are schematic diagrams of the various configurations possible using the configurable integrated circuit of FIG. 3.

FIG. 5 shows a cross-section of a portion of a configurable integrated circuit incorporating a zener diode in a sinker of a vertical bipolar transistor, in accordance with the invention.

FIG. 6 shows the device of FIG. 3 but incorporating a zener diode with a higher breakdown voltage.

FIG. 10a shows a top view of a portion of a configurable integrated circuit incorporating a diffused resistor in a sinker of a vertical transistor, in accordance with the invention.

FIGS. 10b and 10c are schematic diagrams of one possible configuration possible using the configurable integrated circuit of FIG. 10a.

FIG. 11 shows a cross-section of a zener diode formed in a guard ring of a lateral PMOS transistor, in accordance with the invention.

DETAILED DESCRIPTION

Figure 3:
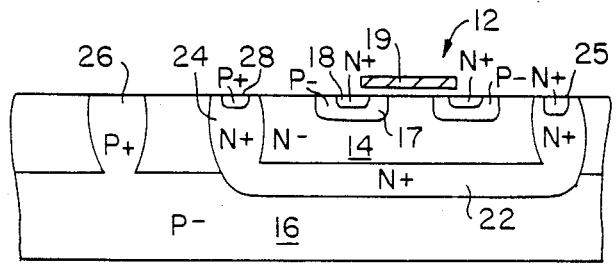
FIG. 3 shows a cross-section of a portion of a configurable integrated circuit incorporating a zener diode in a sinker of a vertical DMOS transistor, in accordance with the invention.

FIG. 3 shows one embodiment of the invention wherein a well known active device, such as N-channel vertical DMOS (VDMOS) transistor 12, is formed within N− epitaxial layer 14. N− epitaxial layer 14 is formed on P− substrate 16 using well-known methods. VDMOS 12 is formed using well-known methods including forming P− body region 17 within N− epitaxial layer 14 and forming highly doped N+ source region 18 within P− body region 17. A gate 19, comprising, for example, doped polysilicon, is formed over the channel region of the VDMOS transistor 12.

To form a drain for VDMOS transistor 12, a highly doped N+ buried layer 22 is formed at the interface of P− substrate 16 and N− epitaxial layer 14 by doping P− substrate 16 with slow diffusing N type dopants before N− epitaxial layer 14 is formed After N− epitaxial layer 14 is formed over P− substrate 16, the N type dopants forming the buried layer are diffused up into N− epitaxial layer 14 to form N+ buried layer 22 in FIG. 3. This buried layer may be eliminated if the substrate is of an N+ type.

N+ sinker region 24 is formed to contact N+ buried layer 22 and forms part of the drain region of VDMOS 12. Sinker region 24 must be highly doped so as to provide low ohmic contact to N+ buried layer 22 and to reduce the beta of any parasitic transistor which may be formed by the various P and N type regions. N+ sinker 24 may be formed by ion implantation of fast diffusing N type dopants into N− epitaxial layer 14 and driven-in so that N+ sinker 24 extends from N+ buried layer 22 to the surface of the wafer. If N− epitaxial layer 14 is very thick, down-diffusion from fast diffusing N type dopants implanted through the surface of epitaxial layer 14 combined with up-diffusion from fast diffusing N type dopants selectively deposited in P− substrate 16 prior to the formation of N− epitaxial layer 14 is required to form a deep merged N+ sinker.

Figure 1:
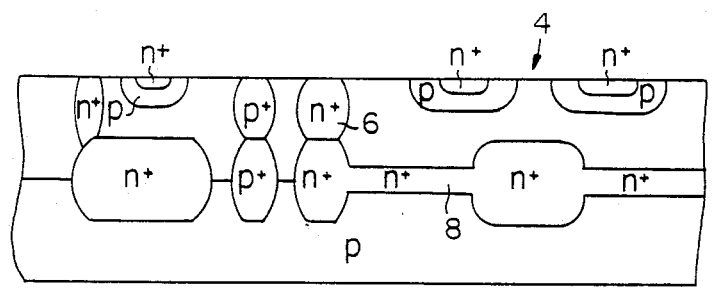
FIG. 1 shows a cross-section of a prior art vertical transistor using a sinker.
Figure 2:
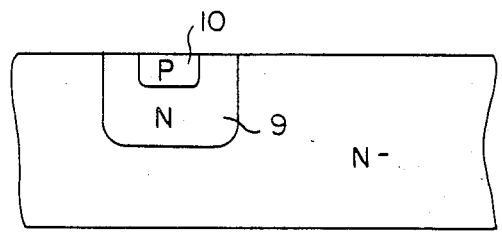
FIG. 2 shows a cross-section of a basic zener diode.

The above-described processes are extremely well known in the art as illustrated by U.S. Pat No. 4,589,004 to Yasuda, described with respect to FIG. 1.

An additional N+ sinker contact region 25, with an impurity concentration on the order of $10^{20}$ dopants/cm$^3$, may be needed to avoid any Schottky diode effects between a metal contact and sinker region 24.

P+ isolation regions 26 are formed to contact P− substrate 16 in order to provide isolation of the VDMOS 12 device from surrounding devices. These P+ isolation regions 26 may be formed With a process similar to that described with respect to N+ sinker region 24.

As previously stated, in a configurable integrated circuit, the metallization mask forming the various contacts and interconnections to and between the various regions, such as those surface regions in FIG. 3, are specified by the user. In prior art configurable integrated circuits, regions similar to N+ sinker region 24, forming part of a vertical transistor, are not designed to be configurable as an anode or cathode of a zener diode.

In FIG. 3, highly doped P+ anode region 28 is formed within N+ sinker 24 and is exposed on the surface of the wafer. P+ region 28, in conjunction with N+ sinker 24, form a zener diode having a breakdown of approximately six volts. P+ region 28 may be formed using a separate masking step to expose a portion of N+ sinker 24 and then using ion implantation or other well-known procedure to embed P type impurities within N+ sinker 24 to form P+ region 28. In one embodiment, the impurity concentration in P+ region 28 is on the order of $2 \times 10^{19}$ dopants/cm$^3$. N+ sinker 24 has an impurity concentration on the order of $10^{19}$ dopants/cm$^3$.

As seen from FIGS. 4a and 4b, the user may specify a metal interconnect for the device of FIG. 3 which can provide either: a transistor by itself, as shown in FIG. 4a; or, the zener diode by itself, as shown in FIG. 4b.

The configuration of FIG. 4a may be made by simply not connecting a separate metal interconnect to the P+ anode region 28.

The configuration of FIG. 4b may be made by configuring the metallization mask to provide a first metal interconnect contacting N+ sinker 24 for the cathode and a second metal interconnect to contact P+ region 28 for the anode. Alternatively, to provide the configuration of FIG. 4b, the mask can provide a first interconnect to N+ source 18 and P− body region 16, for the cathode, and a second interconnect to P+ anode region 28, while maintaining the potential on gate 20 at a high level for always biasing the transistor 12 in an ON state.

The VDMOS transistor 12 in FIG. 3 can be substituted by a bipolar transistor, as shown in FIG. 5, wherein N+ sinker 24 contacts buried layer 22 and provides the collector contact. In this embodiment, P base region 40 is formed within N− epitaxial region 14, and N+ emitter region 42 is formed within base region 40. P+ anode region 28 is formed in sinker 24. The configurations possible are identical to those shown in FIGS. 4a and 4b except with the VDMOS transistor replaced with a bipolar transistor.

All conductivity types discussed with respect to FIGS. 3 and 5 may be made opposite types with the same advantages of a zener diode formed using a sinker being evident.

In another embodiment of a diode using a sinker region, shown in FIG. 6, N+ sinker 24, in conjunction with N+ sinker contact region 25, forms a cathode of a high breakdown voltage avalanche diode by first counterdoping the surface portion of N+ sinker 24 with a first concentration of P type impurities, such as boron, to form N− region 32, having a composite concentration after compensation in the range of $10^{17}$ dopants/cm$^3$, within N+ sinker 24. An additional implantation of P type dopants then follows, forming P+ anode region 34 within N− region 32.

This same N− region 32, which is desirable to form zener diodes (actually avalance diodes) with breakdown voltages greater than 6–8 volts, can also be formed by simply masking the surface of the wafer prior to implantation of the N type sinker dopants such that N type sinker dopants are prevented from being implanted into the area surrounding where the zener diode anode is to be formed. After the N type sinker dopants are implanted and driven-in, the area of the sinker which was protected by the mask will have a concentration of N type dopants which is lower than in the surrounding sinker region. Thus, the lightly doped N− region 32 in FIG. 6 is formed solely from the side diffusion of N type sinker dopants into the protected region. Alternatively, for greater control over the impurity concentration in N− region 32, the mask-protected area can be made relatively large so that the side diffusion into the protected area is insufficient to form the desired N− region 32. Sheet implantation of N type dopants may then be conducted to form N− region 32 having the desired concentration. By forming N− region 32 by selectively blocking the implantation of N type sinker dopants, no additional masks or masking steps are needed to form N− region 32. Additionally, using this particular masking method, the sizes of the areas blocked can be varied to enable the formation of zener diodes having different breakdown voltages. Still further, an additional masking step can be incorporated to selectively further dope the low concentration areas with N type dopants to further control the concentration of the N− regions 32.

The transistor/zener diode configuration of FIG. 6 may be generally configured as FIGS. 4a and 4b. Avalanche diodes, providing higher breakdown voltages than true zener type diodes, would find applicability in higher voltage type configurable integrated circuits.

Figure 7:
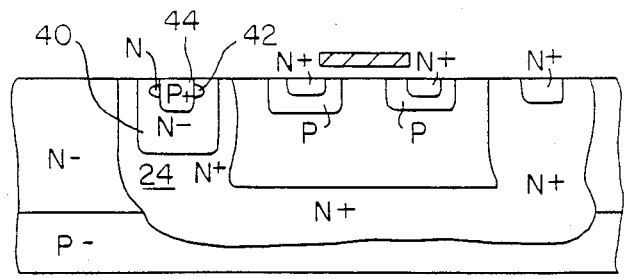
FIG. 7 shows the device of FIG. 6 but incorporating a zener diode having a buried region.

In another embodiment, shown in FIG. 7, the avalanche diode of FIG. 6 is modified to have a more controllable breakdown voltage. In FIG. 7, N+ sinker 24 is first counterdoped with P type impurities, such as boron, to create N− region 40, having a concentration in the range of $10^{17}$ dopants/cm$^3$, within N+ sinker 24.

N− region 40 can also be formed by blocking N type sinker dopants from being implanted into an area surrounding the anticipated anode region, as described with respect to FIG. 6.

An implant of slow diffusing N type impurities, such as arsenic, is then used to produce N buried layer 42 within N− region 40. P type impurities, such as boron, are then implanted to form P+ region 44 within N− region 40 and intersecting N buried layer 42.

Buried layer 42 acts to cause the breakdown of the diode to occur at a location below the surface of the wafer at the junction of P+ region 44 and N buried layer 42. By causing the breakdown to occur away from the surface, electrons and holes do not become trapped in the oxide overlying the surface, in contrast to surface breakdowns, and threshold (or knee) shifting due to trapped electrons and holes is avoided.

Concentrations of the impurities in the regions of the various embodiments described above may be varied as necessary to create desired breakdown voltages. The depths and widths of the various regions may also be adjusted based on the particular operating voltage and current levels. The impurity concentrations, depths, and widths of the regions may be determined by the manufacturer of the configurable integrated circuit using well known methods.

Figure 8:
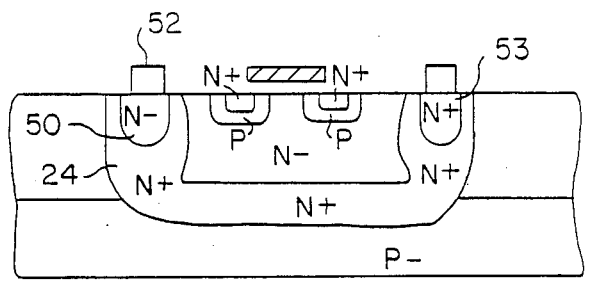
FIG. 8 shows a cross-section of a portion of a configurable integrated circuit incorporating a Schottky diode in a sinker of a vertical DMOS transistor, in accordance with the invention.

In another embodiment, shown in FIG. 8, a lightly doped N− region 50 is formed within N+ sinker 24 using counterdoping, or other techniques previously mentioned, and Schottky metal 52, used for all metal interconnections in this embodiment, is formed during the metallization process to contact N− region 50. Thus, the Schottky metal 52 in contact with N− region 50 forms a Schottky diode. N+ sinker contact region 53 is used to provide ohmic contact to sinker 24.

Figure 9:
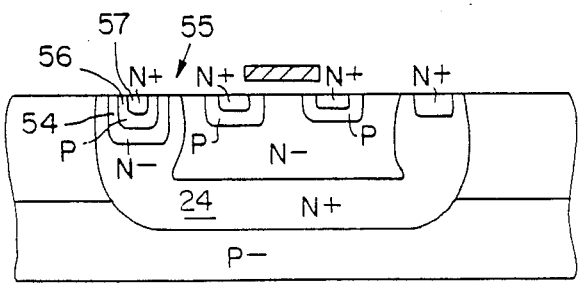
FIG. 9 shows a cross-section of a portion of a configurable integrated circuit incorporating an NPN transistor in a sinker of a vertical DMOS transistor, in accordance with the invention.

In another embodiment, shown in FIG. 9, a vertical NPN bipolar transistor is embedded in an N− region of the sinker. In FIG. 9, N− region 54, formed using techniques previously described, acts as the collector of NPN transistor 55. P region 56 formed within N− region 54 acts as a base, and N− region 57 formed within P region 56 acts as an emitter.

FIG. 10a is a top view of a portion of a configurable integrated circuit showing a diffused resistor 60 formed in N+ sinker 66. Hence, a diffused resistor may be formed in a sinker without requiring additional die area. Two possible configurations are generally shown in FIGS. 4a and 4b except a resistor is substituted for the zener diode. A third configuration, shown in FIG. 10b, is also possible by connecting the resistor to act in conjunction with a transistor. The diffused resistor 60 of FIG. 10a is formed by forming P+ contacts 62 and 64 within N+ sinker 66 and forming a connecting P− diffused resistor region 60 between the P+ contacts 62 and 64. If high voltage levels are to be used with the device of FIG. 10a, the portion of sinker region 66 surrounding the diffused resistor 60 would need to be more lightly doped using techniques previously described to avoid low voltage breakdown between the P+ resistor contacts 62 and 64 and sinker region 66. This lightly doped region 68 is shown in dashed outline in FIG. 10a. Diffused resistors are well known in the art and a large variety of values may be obtained.

If diffused resistor 60 is desired to be used in conjunction with MOS transistor 70 of FIG. 10a, a metal contact would be configured to connect either P+ contact 62 or 64 directly to N+ sinker 66, and a separate contact would be made to the other P+ contact to form a resistor coupled between this other contact and N+ sinker 66. Thus, a configuration such as shown in FIG. 10b may be obtained where a transistor is formed with a load resistor. By substituting a bipolar transistor, such as shown in FIG. 5, for MOS transistor 70, the configuration shown in FIG. 10c may be obtained.

Shown in FIG. 11 is a zener diode 76 formed in guard ring 78. Guard ring 78 is used to isolate lateral PMOS transistor 80 from other devices formed in N− epitaxial layer 82. P+ anode 84 and N− cathode region 86 of zener diode 76 are formed using techniques similar to those used to form anode 34 and cathode 32 in FIG. 6.

All devices hidden in the sinkers of FIGS. 3–10a may also be formed in guard ring 78 using methods similar to those described with respect to FIGS. 3–10a.

It should be appreciated that the above-described diffused resistors, diodes, and transistors may be formed within the same sinker or guard ring to greatly increase the number of components available on a configurable integrated circuit.

The teachings of this invention find their greatest applicability in configurable integrated circuits which use vertical transistors having one contact being made through an associated highly doped sinker region. However, this invention also finds applicability in configurable integrated circuits where isolation regions are not necessarily used as a contact of a transistor. Thus, by using this invention, configurable integrated circuits can incorporate a larger number of zener diodes, resistors, and transistors having selectable characteristics without requiring additional real estate. As a consequence, die area previously dedicated to independently formed zener diodes, resistors, and transistors may be made available for other components.

The present invention has been described with reference to the preferred and alternative embodiments thereof, however, the invention is not intended to be limited to the herein described embodiments. Various modifications in form and structure will be obvious to those skilled in the art while keeping with the spirit and scope of the invention.

I claim:

1. A diode structure comprising:
   a first conductivity type region of said diode formed in a sinker region of a vertical transistor,
   said sinker region acting as a second conductivity type region of said diode,
   said vertical transistor being incorporated in a configurable integrated circuit.

2. The diode structure of claim 1 wherein said diode is a zener diode.

3. The diode structure of claim 1 wherein said vertical transistor is a vertical MOS transistor.

4. The diode structure of claim 1 wherein said vertical transistor is a vertical bipolar transistor.

5. The diode structure of claim 1 wherein said first conductivity type region is of P type conductivity.

6. The diode structure of claim 1 wherein said first conductivity type is of N type conductivity.

7. A diode structure comprising:
   a first conductivity type region of said diode formed in a first region of a second conductivity type within a sinker region of a vertical transistor,
   said sinker region being of said second conductivity type and being more highly doped than said first region,
   said first region and said sinker region, in conjunction, acting as a second conductivity type region of said diode,
   said vertical transistor being incorporated in a configurable integrated circuit.

8. The diode structure of claim 7 wherein said diode is a zener diode.

9. The diode structure of claim 7 wherein said vertical transistor is a vertical MOS transistor.

10. The diode structure of claim 7 wherein said vertical transistor is a vertical bipolar transistor.

11. The diode structure of claim 7 wherein said first conductivity type region is of P type conductivity.

12. The diode structure of claim 7 wherein said first conductivity type is of N type conductivity.

13. A diode structure comprising:
    a first conductivity type region of said diode formed in a first region of a second conductivity type within a sinker region of a vertical transistor,
    said sinker region being of said second conductivity type and being more highly doped than said first region,
    said first region also containing a buried layer of said second conductivity type contacting said first conductivity type region, said buried layer being more highly doped than said first region,
    said first region, said buried layer, and said sinker region, in conjunction, acting as a second conductivity type region of said diode,
    said vertical transistor being incorporated in a configurable integrated circuit.

14. The diode structure of claim 13 wherein said diode is a zener diode.

15. The diode structure of claim 13 wherein said vertical transistor is a vertical MOS transistor.

16. The diode structure of claim 13 wherein said vertical transistor is a vertical bipolar transistor.

17. The diode structure of claim 13 wherein said first conductivity type region is of P type conductivity.

18. The diode structure of claim 13 wherein said first conductivity type is of N type conductivity.

19. A diode structure comprising:
    a first region of a second conductivity type within a sinker region of a vertical transistor,
    said sinker region being of said second conductivity type and being more highly doped than said first region,
    said first region and said sinker region, in conjunction, acting as a second conductivity type region of said diode,
    said vertical transistor being incorporated in a configurable integrated circuit wherein a Schottky metal is used in a metal interconnect layer so as to contact said first region and form an anode of said diode.

20. The diode structure of claim 19 wherein said vertical transistor is a vertical MOS transistor.

21. The diode structure of claim 19 wherein said vertical transistor is a vertical bipolar transistor.

22. The diode structure of claim 19 wherein said first conductivity type region is of P type conductivity.

23. The diode structure of claim 19 wherein said first conductivity type is of N type conductivity.

24. A resistor structure comprising:
   a first conductivity type region formed in a sinker region of a vertical transistor, said sinker region being of a second conductivity type,
   said first conductivity type region forming a diffused resistor,
   said vertical transistor being incorporated in a configurable integrated circuit.

25. The resistor structure of claim 24 further comprising doped regions of said first conductivity type contacting ends of said diffused resistor of said first conductivity type, said doped regions being more highly doped than said first conductivity type region.

26. The resistor structure of claim 24 wherein said vertical transistor is a vertical MOS transistor.

27. The resistor structure of claim 24 wherein said vertical transistor is a vertical bipolar transistor.

28. The resistor structure of claim 24 wherein said first conductivity type region is of P type conductivity.

29. The resistor structure of claim 24 wherein said first conductivity type is of N type conductivity.

30. A resistor structure comprising:
   a first conductivity type region formed in a first region of a second conductivity type within a sinker region of a vertical transistor,
   said sinker region being of said second conductivity type and being more highly doped than said first region,
   said first conductivity type region forming a diffused resistor,
   said vertical transistor being incorporated in a configurable integrated circuit.

31. The resistor structure of claim 30 further comprising doped regions of said first conductivity type contacting ends of said diffused resistor of said first conductivity type, said doped regions being more highly doped than said first conductivity type region.

32. The resistor structure of claim 30 wherein said vertical transistor is a vertical MOS transistor.

33. The resistor structure of claim 30 wherein said vertical transistor is a vertical bipolar transistor.

34. The resistor structure of claim 30 wherein said first conductivity type region is of P type conductivity.

35. The resistor structure of claim 30 wherein said first conductivity type is of N type conductivity.

36. A bipolar transistor structure comprising:
   a first conductivity type region formed in a first region of a second conductivity type within a sinker region of a vertical transistor, said first conductivity type region acting as base region of said bipolar transistor,
   said sinker region being of said second conductivity type and being more highly doped than said first region,
   said first region and said sinker region, in conjunction acting as a collector region of said bipolar transistor; and 'a second region of said second conductivity type formed in said first conductivity type region, said second region acting as an emitter of said bipolar transistor,
   said vertical transistor being incorporated in a configurable integrated circuit.

37. A diode structure comprising:
   a first conductivity type region of said diode formed in a first region of a second conductivity type within a guard ring of a lateral transistor,
   said guard ring being of said second conductivity type and being more highly doped than said first region,
   said first region and said guard ring, in conjunction, acting as a second conductivity type region of said diode,
   said transistor being incorporated in a configurable integrated circuit.

* * * * *